United States Patent [19]

Uchida

[11] Patent Number: 5,694,361
[45] Date of Patent: Dec. 2, 1997

[54] OUTPUT CIRCUIT

[76] Inventor: Toshiya Uchida, c/o Fujitsu Limited, 1015, Kamikodanaka, Nakahara-ku, Kawasaki-shi, Kanagawa 211, Japan

[21] Appl. No.: 376,089

[22] Filed: Jan. 20, 1995

Related U.S. Application Data

[63] Continuation of Ser. No. 33,710, Mar. 18, 1993, abandoned.

[30] Foreign Application Priority Data

Mar. 18, 1992 [JP] Japan .................. 4-061786

[51] Int. Cl.$^6$ ............................................. G11C 7/00
[52] U.S. Cl. ................ 365/189.05; 365/189.09; 365/194; 307/473
[58] Field of Search .................... 365/189.05, 194, 365/189.09; 307/473

[56] References Cited

U.S. PATENT DOCUMENTS

| | | | |
|---|---|---|---|
| 4,797,573 | 1/1989 | Ishimoto | 365/194 X |
| 5,043,944 | 8/1991 | Nakamura et al. | 365/189.05 |
| 5,241,502 | 8/1993 | Lee et al. | 365/189.05 |
| 5,305,271 | 4/1994 | Watanabe | 307/473 X |
| 5,311,076 | 5/1994 | Park et al. | 307/473 X |

*Primary Examiner*—Do Hyun Yoo

[57] ABSTRACT

The turn-on time of an output transistor is minimized to suppress the average value of the load current, and the load is electrically charged with an intermediate potential prior to outputting data to suppress the instantaneous value of the load current. The output circuit holds the load in an open state when a predetermined reset signal has a first logic level, and drives the load from a high-potential side power source or a low-potential side power source depending on the logic level of the output data when said predetermined reset signal changes to a second logic level, wherein the timing at which the reset signal changes from the first logic to the second logic is delayed at least until the logic level of the output data has settled. Furthermore, the load is driven at an intermediate potential between the high-potential side power source voltage, and the low-potential side power source voltage and is then driven on the high-potential side power source or the low-potential side power source depending on the logic level of the output data.

14 Claims, 17 Drawing Sheets

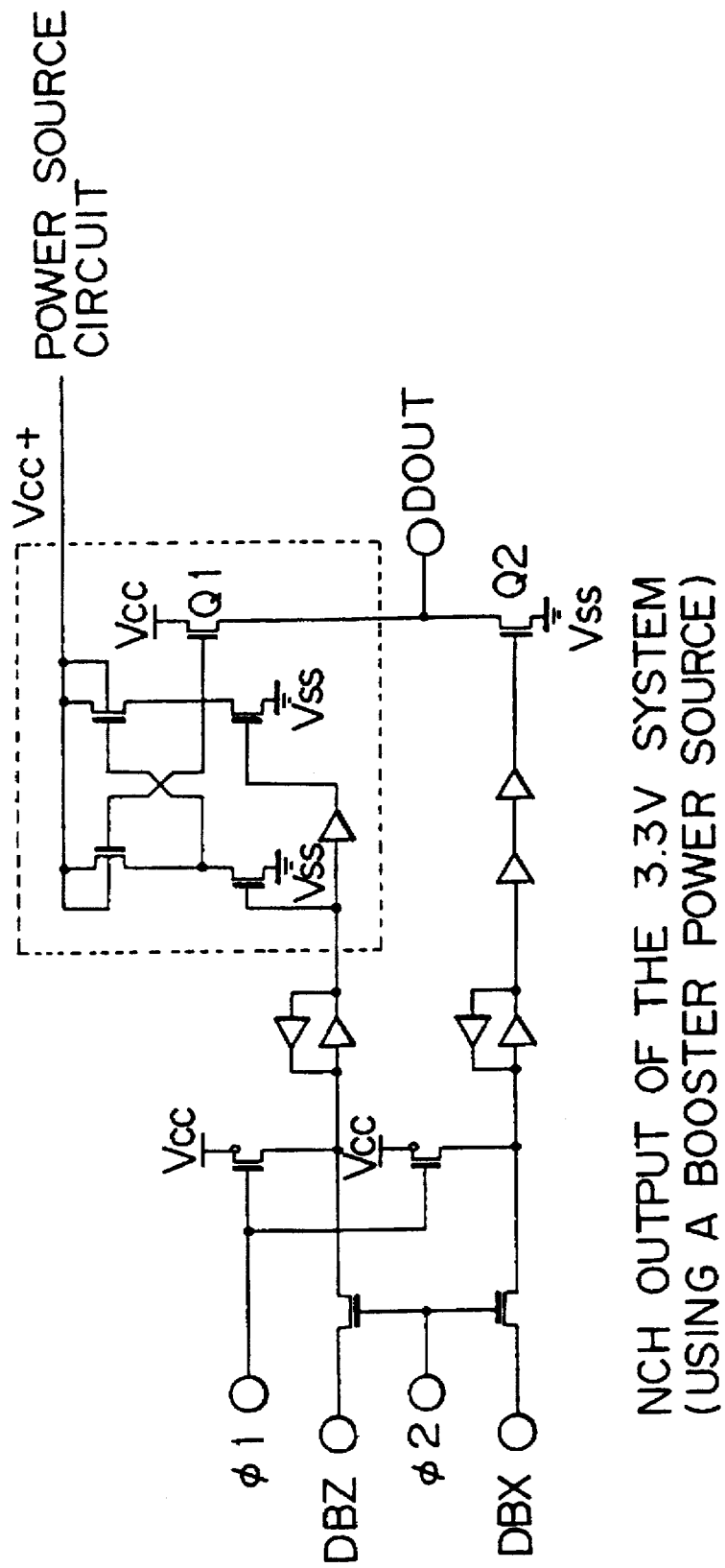

NCH OUTPUT OF THE 3.3V SYSTEM
(BOOSTING LEVEL IS GENERATED DURING
OUTPUT PERIOD ONLY)

Fig. 18

| OPERATION MODE | NON-EDO DEVICE | | EDO DEVICE | |
|---|---|---|---|---|
| | ONE-BIT DEVICE | MULTI-BIT DEVICE | ONE-BIT DEVICE | MULTI-BIT DEVICE |
| NORMAL DEVICE | 1ST EXAMPLE 2ND EXAMPLE | 1ST EXAMPLE 2ND EXAMPLE | 1ST EXAMPLE 2ND EXAMPLE | 1ST EXAMPLE 2ND EXAMPLE |
| HIGH-SPEED PAGING DEVICE | 1ST EXAMPLE 2ND EXAMPLE | 1ST EXAMPLE 2ND EXAMPLE | 3RD EXAMPLE 4TH EXAMPLE | 3RD EXAMPLE 4TH EXAMPLE |
| STATIC COLUMN DEVICE | 3RD EXAMPLE 4TH EXAMPLE | 3RD EXAMPLE 4TH EXAMPLE | DOSE NOT EXIST | DOSE NOT EXIST |
| NIBBLE DEVICE | 1ST EXAMPLE 2ND EXAMPLE | 1ST EXAMPLE 2ND EXAMPLE | 3RD EXAMPLE 4TH EXAMPLE | 3RD EXAMPLE 4TH EXAMPLE |

NCH OUTPUT OF THE
5.0 V SYSTEM

OUTPUT CIRCUIT

This application is a continuation of application Ser. No. 08/033,710 filed Mar. 18, 1993, now abandoned.

BACKGROUND OF THE INVENTION

1. Field of the Invention

The present invention relates to an output circuit and, particularly, to an output circuit which outputs multi-bit data simultaneously.

2. Description of the Related Art

In recent years, the number of bits of data handled by semiconductor integrated devices such as memories is on the increase, e.g., 8 bits, 16 bits, 32 bits, 64 bits, ---, causing a problem of a change in the power source voltage when a number of output loads are driven simultaneously.

FIG. 12 is a diagram illustrating a conventional output circuit (but for one bit only) including an output stage 100, a logic output signal input stage 101, and a reset signal input unit 102. Between the complementary signal output data generated in the circuit, the data DBZ is added to the gate of an output transistor 13 of the high-potential side in the output stage 100 via an NMOS 10, an inverter latch 11 and an inverter 12 (i.e., two stages of inverters) that form the logic signal input stage 101, and the data DBX is similarly added to the gate of an output transistor 18 of the low-potential side in the output stage 100 via an NMOS 14, an inverter latch 15, and inverters 16, 17 (i.e., three stages of inverters).

Therefore, when the output data has a logic level 1 (DBZ=1, DBX=0), the logic level 1 having the same phase as the DBZ is added to the gate of the output transistor 13 of the high-potential side, and the logic level 1 having a phase opposite to that of the DBX is added to the gate of the output transistor 18 of the low-potential side. In this case, therefore, the output transistor 18 of the low-potential side is turned on, and the loads (capacitive loads such as wirings and inputs) connected to the output DOUT are driven by a power source Vss of the low-potential side (e.g., 0 V). Or, when the output data is a logic level 0 (DBZ=0, DBX=1), the output transistor 13 of the high-potential side is turned on, and the loads connected to the output DOUT are driven by a power source Vcc of the high-potential side (e.g., +5V).

Here, symbol $\phi_R$ denotes a reset signal that is applied to the reset signal input unit 102. The above-mentioned output operation is inhibited when the signal $\phi_R$ is the logic level 0. That is, when $\phi_R=0$, the NMOSs 10 and 14 are turned off to inhibit the receipt of DBZ and DBX, whereas the PMOSs 19 and 20 are turned on, permitting the logic level 1 to be applied to the gate of the output transistor 13 of the high-potential side and the logic level 0 to be applied to the gate of the output transistor 18 of the low-potential side. Therefore, during a period (reset period) in which $\phi_R=0$, the output transistors 13 and 18 are both turned off, and the output DOUT is opened.

FIG. 13 is a diagram showing the operation waveforms according to a prior art. During the period in which $\phi_R=0$, the potential of DOUT is determined by the output logic of the previous time. During the period in which $\phi_R=1$, on the other hand, the potential of DOUT is determined twice when the output levels of DBZ and DBX have settled, and when the output levels of DBZ and DBX are still unsettled.

With the above-mentioned conventional output circuit by which the potential of DOUT is determined twice in the period $\phi_R=1$, however, the potential of DOUT greatly changes from a value corresponding to Vcc, to a value corresponding to Vss (or vice versa) in the case (worst case) when a logic level of DOUT at the time when DBZ and DBX are unsettled becomes opposite to a logic level of DOUT at the time when DSZ and DBX have settled, permitting a large lead current to flow.

In particular, the load current increases in proportion to the number of bits in the case of multi-bit data where a number of output loads are simultaneously driven, causing the above-mentioned problem to appear conspicuously, i.e., causing a change in the power source voltage which results in an erroneous operation.

SUMMARY OF THE INVENTION

It is a first object of the present invention to suppress an average value of the load current by minimizing the turn-on time of the output transistors. Moreover, a second object of the invention is to suppress an instantaneous value of the load current by electrically bringing the load to an intermediate potential prior to outputting the data.

The above first object of the present invention is achieved by an output circuit which holds the load in an open state when a predetermined reset signal has a first logic level, and drives the load from a power source of the high-potential side or from a power source of the low-potential side depending on the logic of the output data when the predetermined reset signal changes to a second logic level, wherein the timing at which the reset signal changes form the first logic level to the second logic is delayed at least until the level output of the data has settled.

In order to achieve the above second object, furthermore, the load is driven by an intermediate potential between the power source of the high-potential side and the power source of the low-potential side, and then, the load is driven by either the power source of the high-potential side or the power source of the low-potential side depending on the logic level of the output data.

According to the present invention, therefore, the load is driven by the power source of the high-potential side or by the power source of the low-potential side after the level of the output data has settled. This helps avoid unnecessary loads from being driven and helps suppress an average value of load current.

Moreover, since the load is driven in advance by an intermediate potential, a reduced potential difference between the intermediate potential and the high-potential power source (or the low-potential power source) makes it possible to suppress the instantaneous value of the load current.

3

Figure 8:
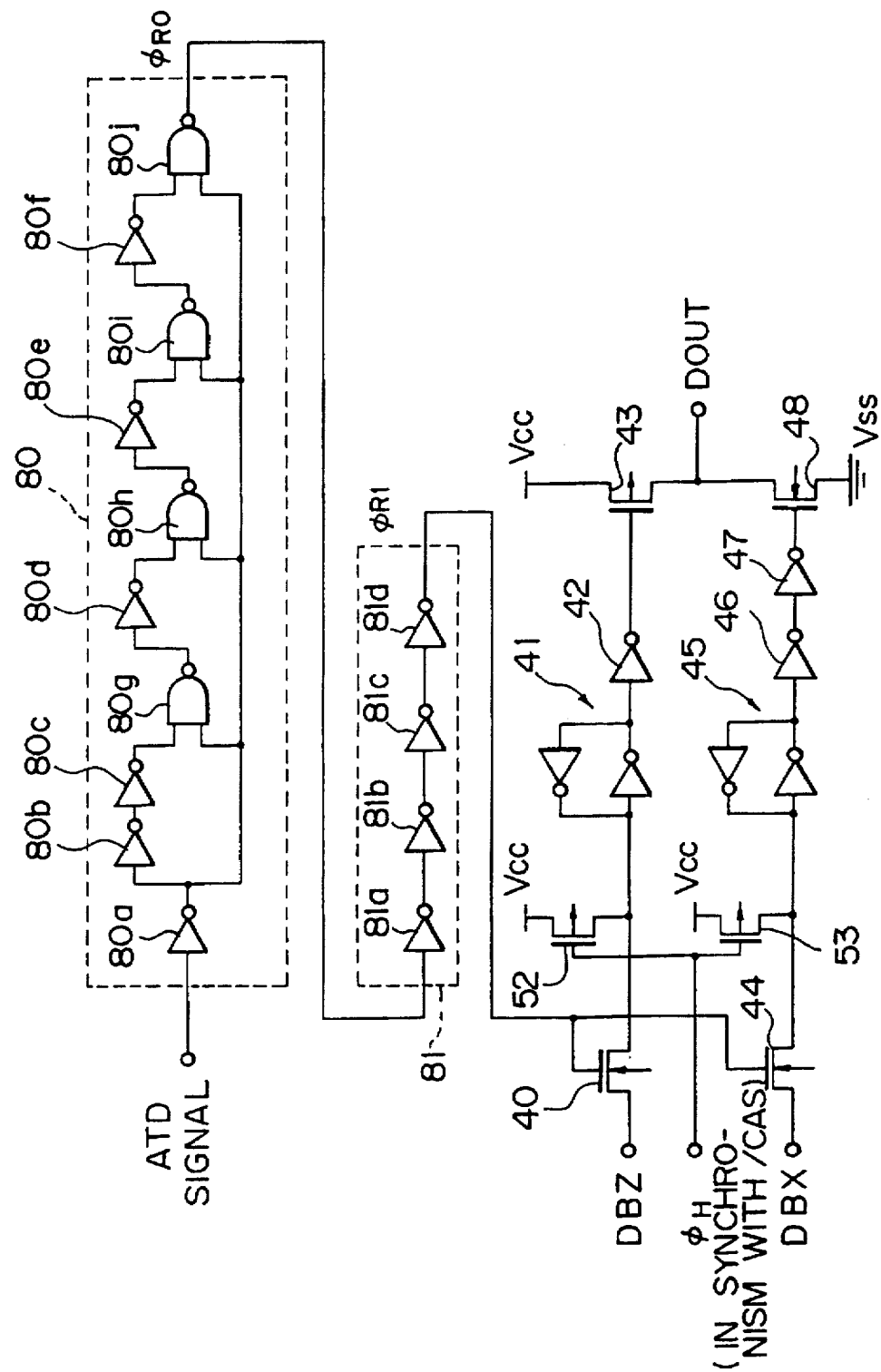
Figure 9:
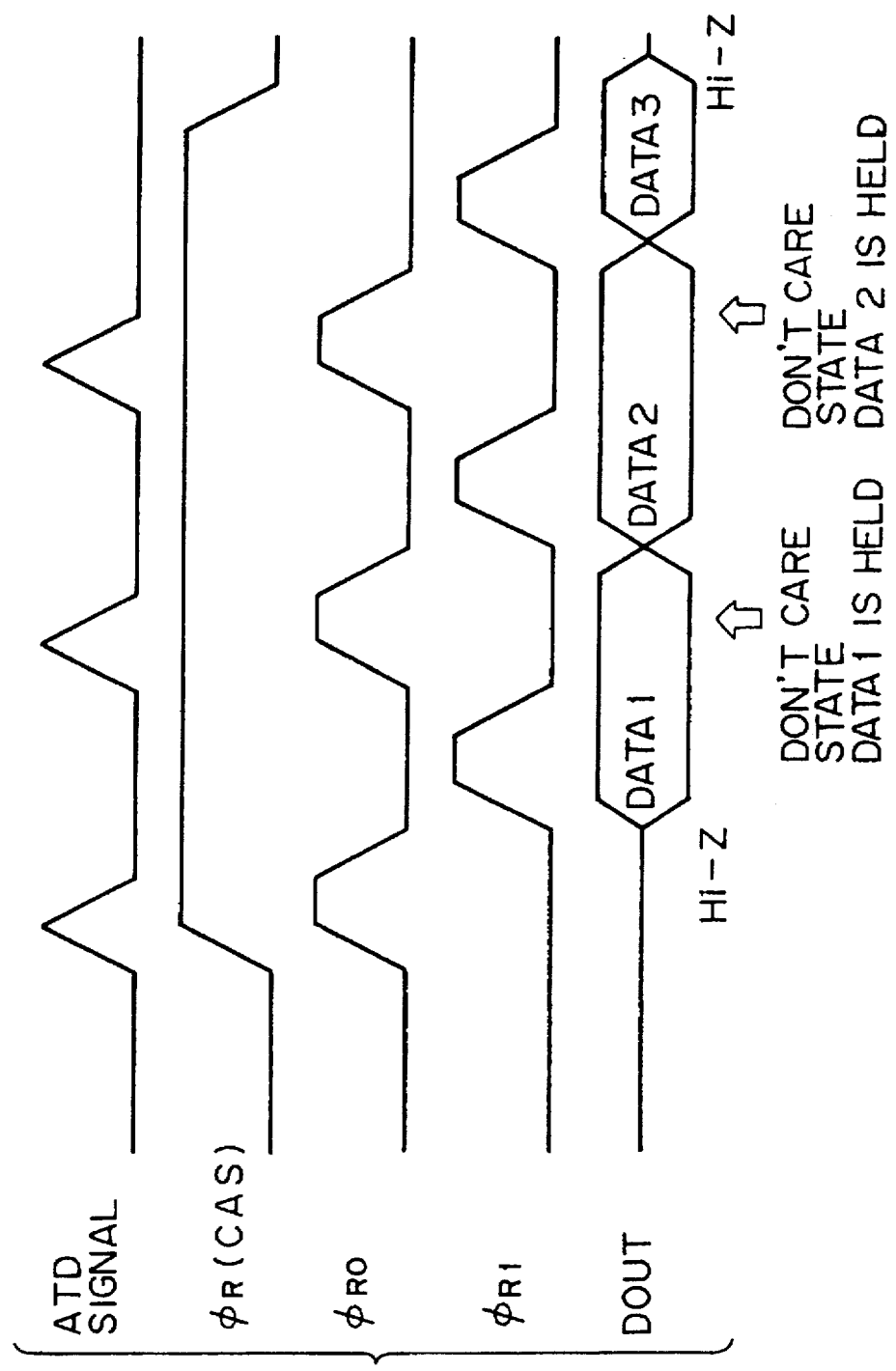
Figure 10:
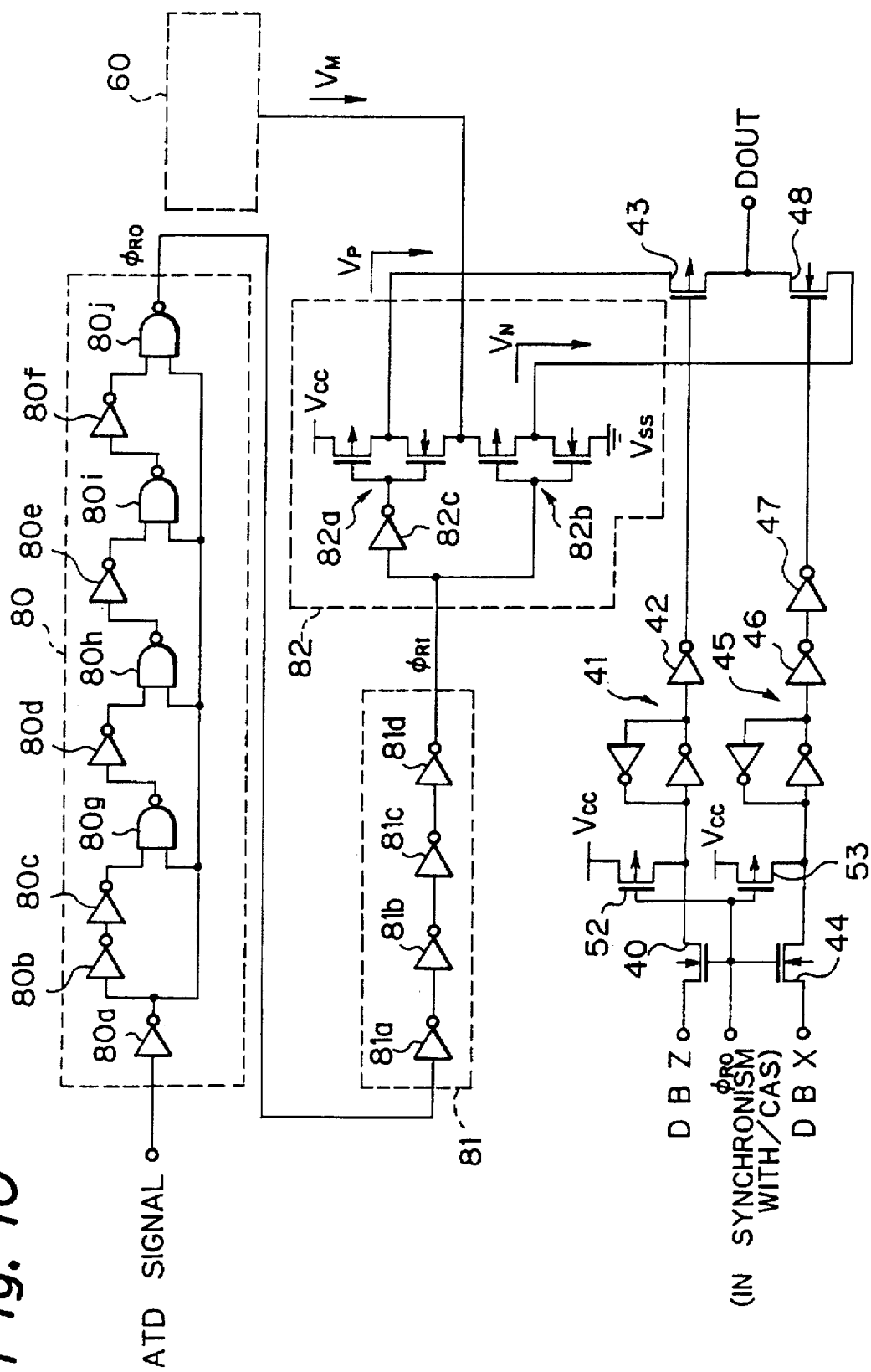
Figure 11:
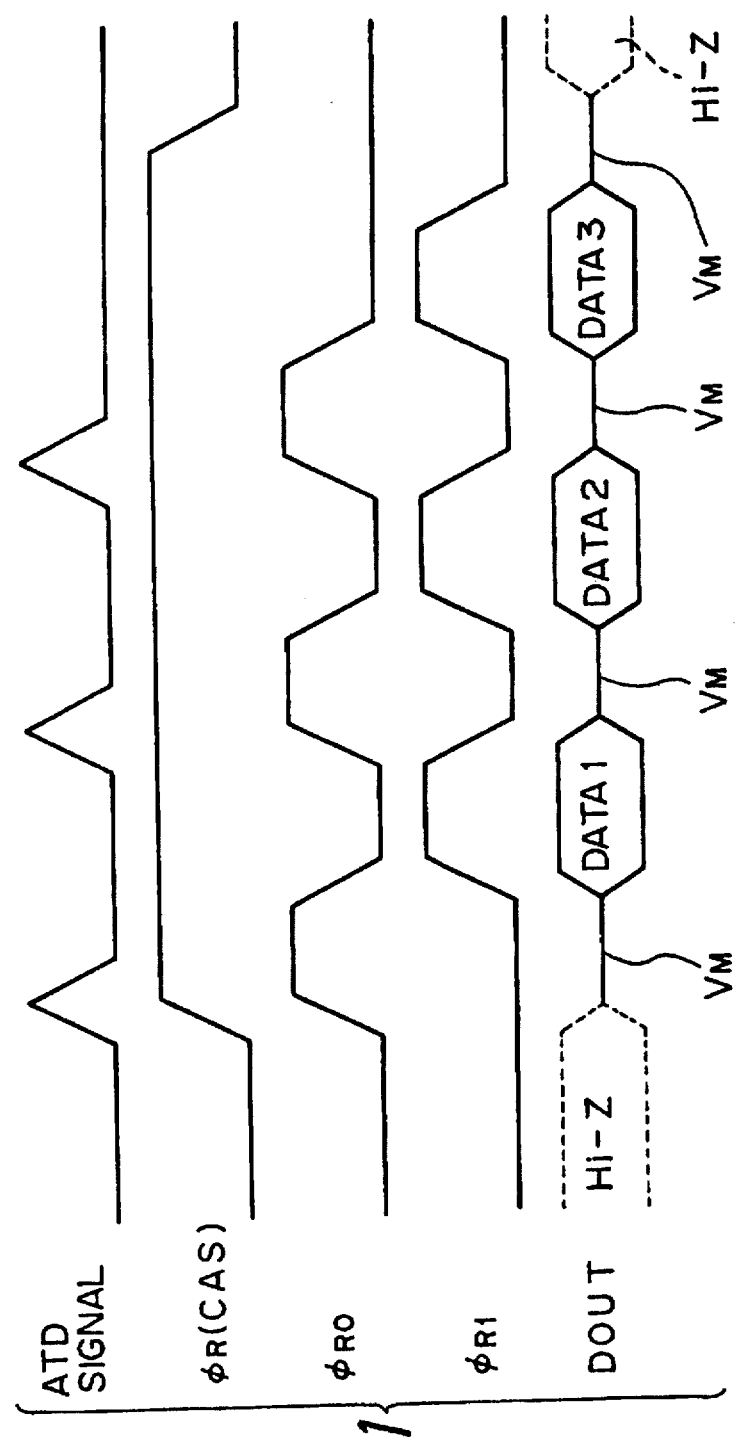
Figure 12:
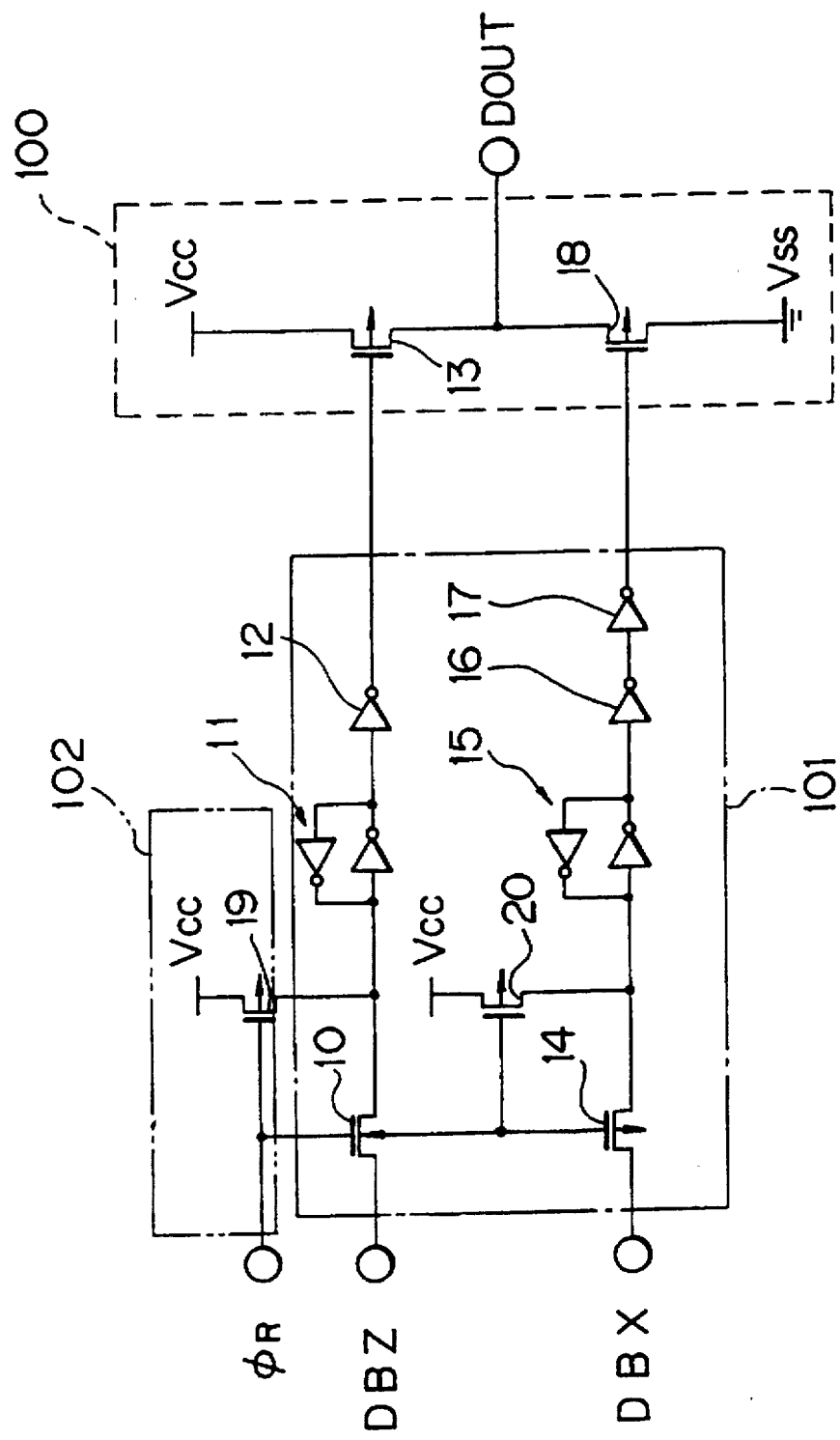
Figure 13:
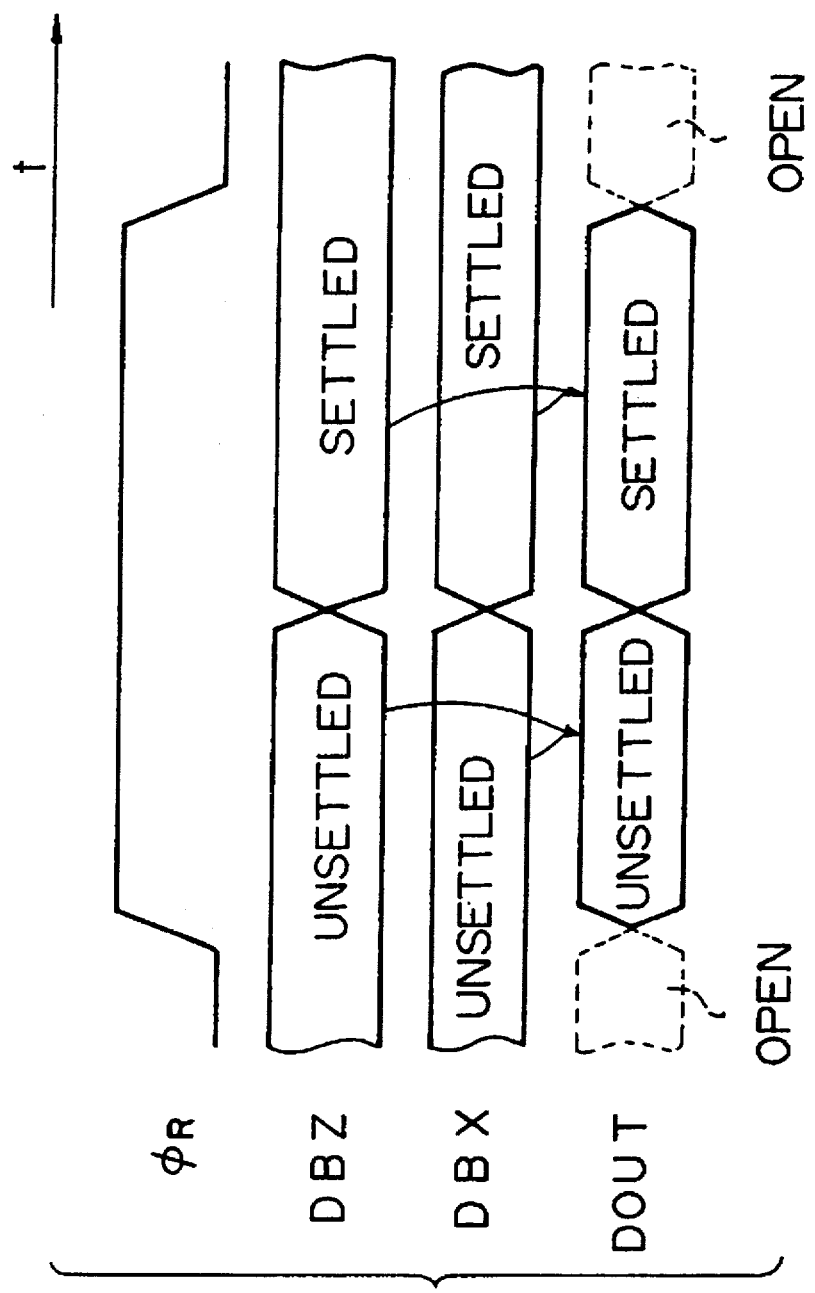
Figure 17B:
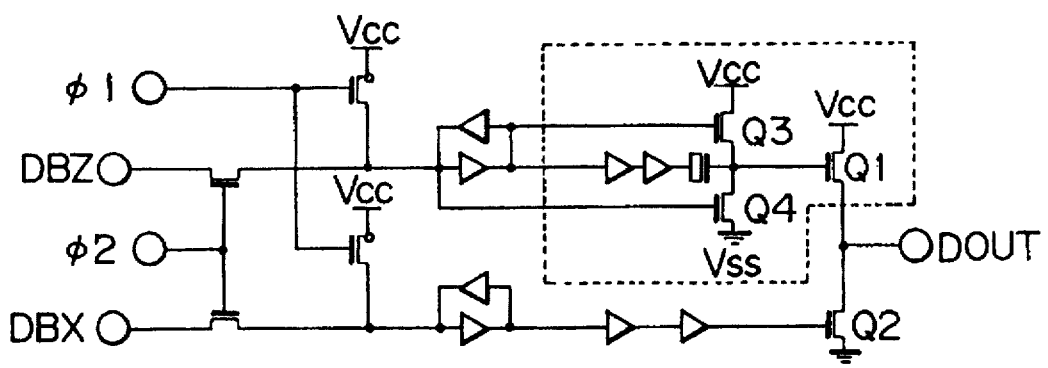
Figure 14:
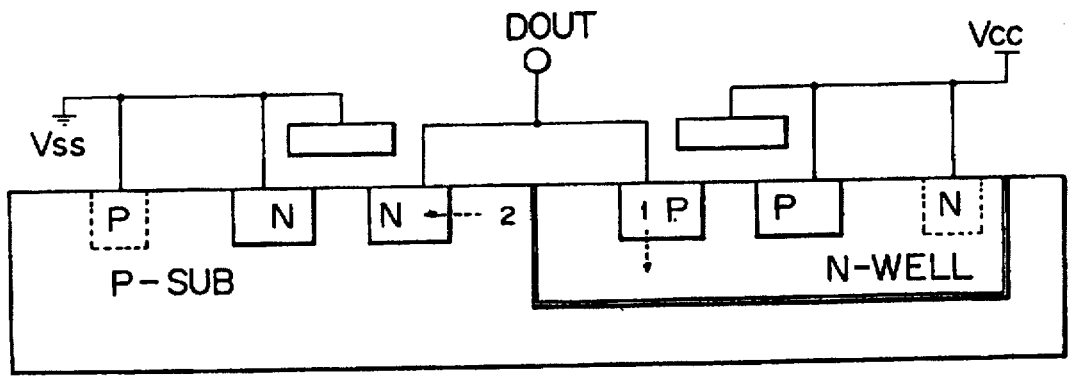
Figure 15:
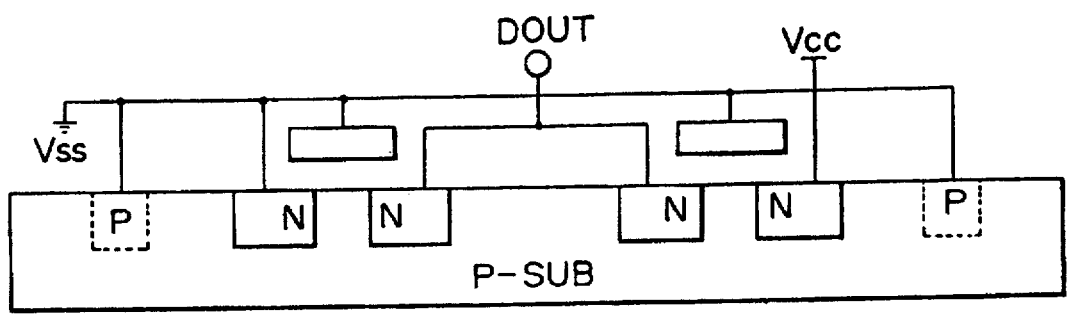
Figure 16:
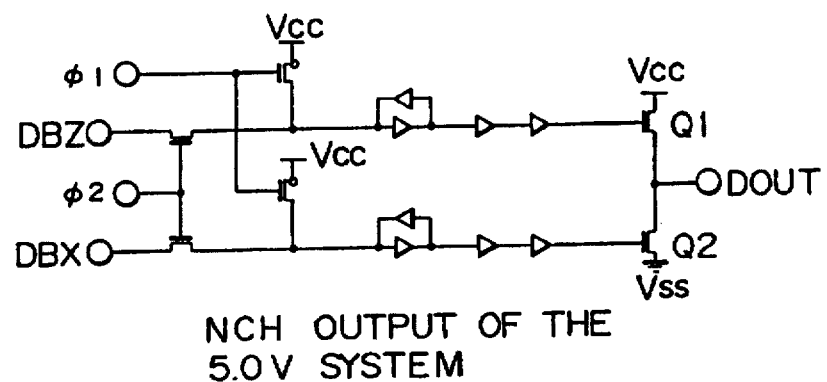

FIG. 8 is a diagram of a constitution according to a third embodiment;

FIG. 9 is a diagram of operation waveforms according to the third embodiment;

FIG. 10 is a diagram of a constitution according to a fourth embodiment;

FIG. 11 is a diagram of operation waveforms according to the fourth embodiment;

FIG. 12 is a diagram of a constitution according to a prior art;

FIG. 13 is a diagram of operation waveforms according to the prior art;

FIG. 14 is a diagram illustrating an example in which the transistors in the output stage are CMOS transistors;

FIG. 15 is a diagram illustrating an example in which the transistors in the output stage are Nch-Nch MOSFETs;

FIG. 16 is a diagram showing a circuit constitution of the case where the output stage of Nch-Nch MOSFETs is used in 5.0V system;

FIG. 17(A) is a diagram illustrating a constitution of the case where the output stage of Nch-Nch MOSFETs is used in a 3.3V system while employing a booster circuit;

FIG. 17(B) is a diagram of the case where there is incorporated a circuit that generates a boosted level only during the period of output in the same circuit; and FIG. 18 is a diagram illustrating relationships between the standards and modes of DRAMS to which the present invention is applied.

DETAILED DESCRIPTION OF THE PREFERRED EMBODIMENTS

The embodiments of the present invention will now be described in conjunction with the drawings.

According to a first embodiment of the present invention, the output circuit holds the load in an open state when a predetermined reset signal is a first logic level, and drives the load from a high-potential power source or an low-potential power source depending on the logic level of the output data when the predetermined reset signal changes to a second logic level, wherein the timing at which the external reset signal changes from the first logic level to the second logic level is delayed at least until the level of the output data has settled.

Figure 1:
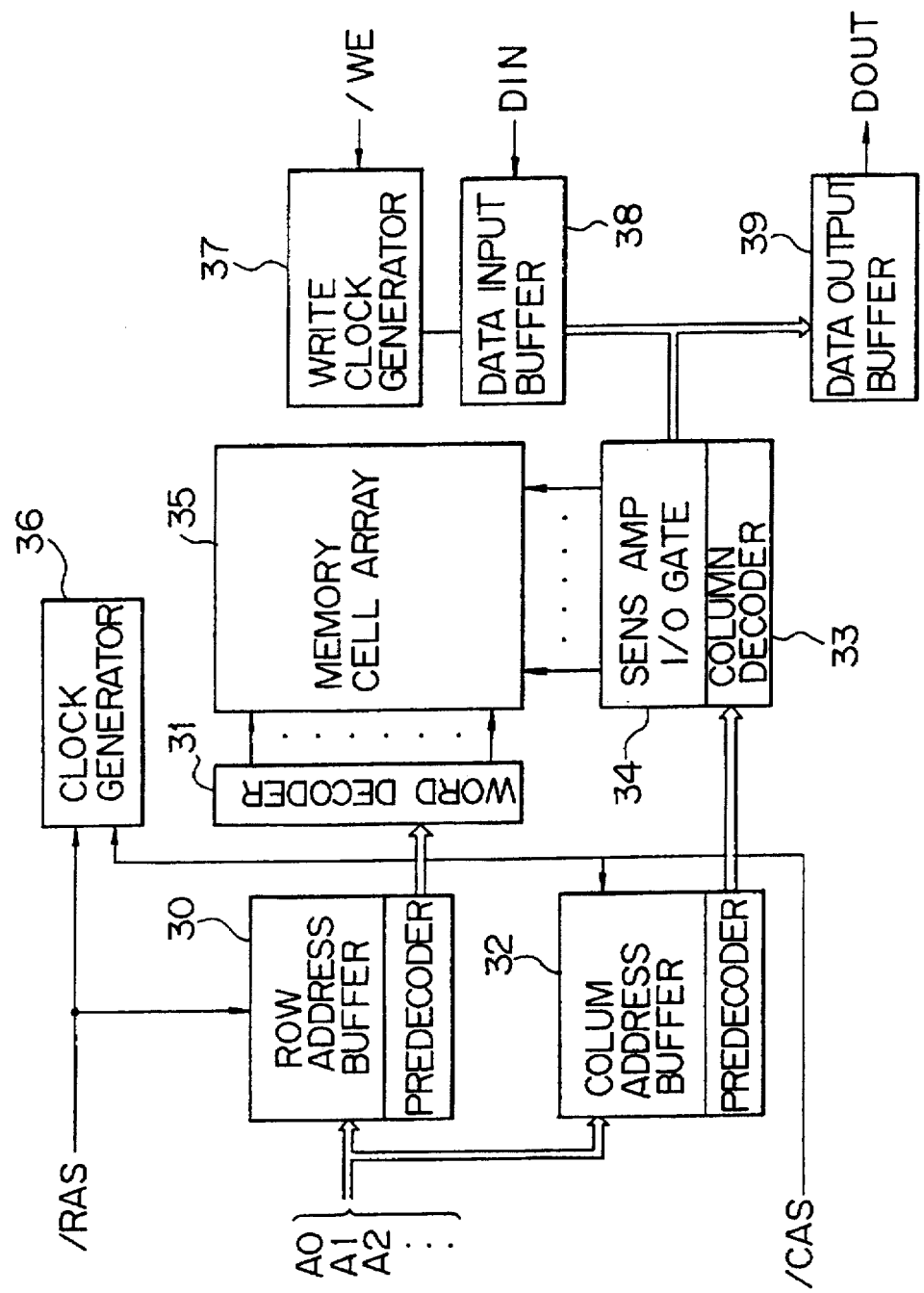
FIG. 1 is a block diagram of a memory device to which the present invention is applied.
Figure 2:
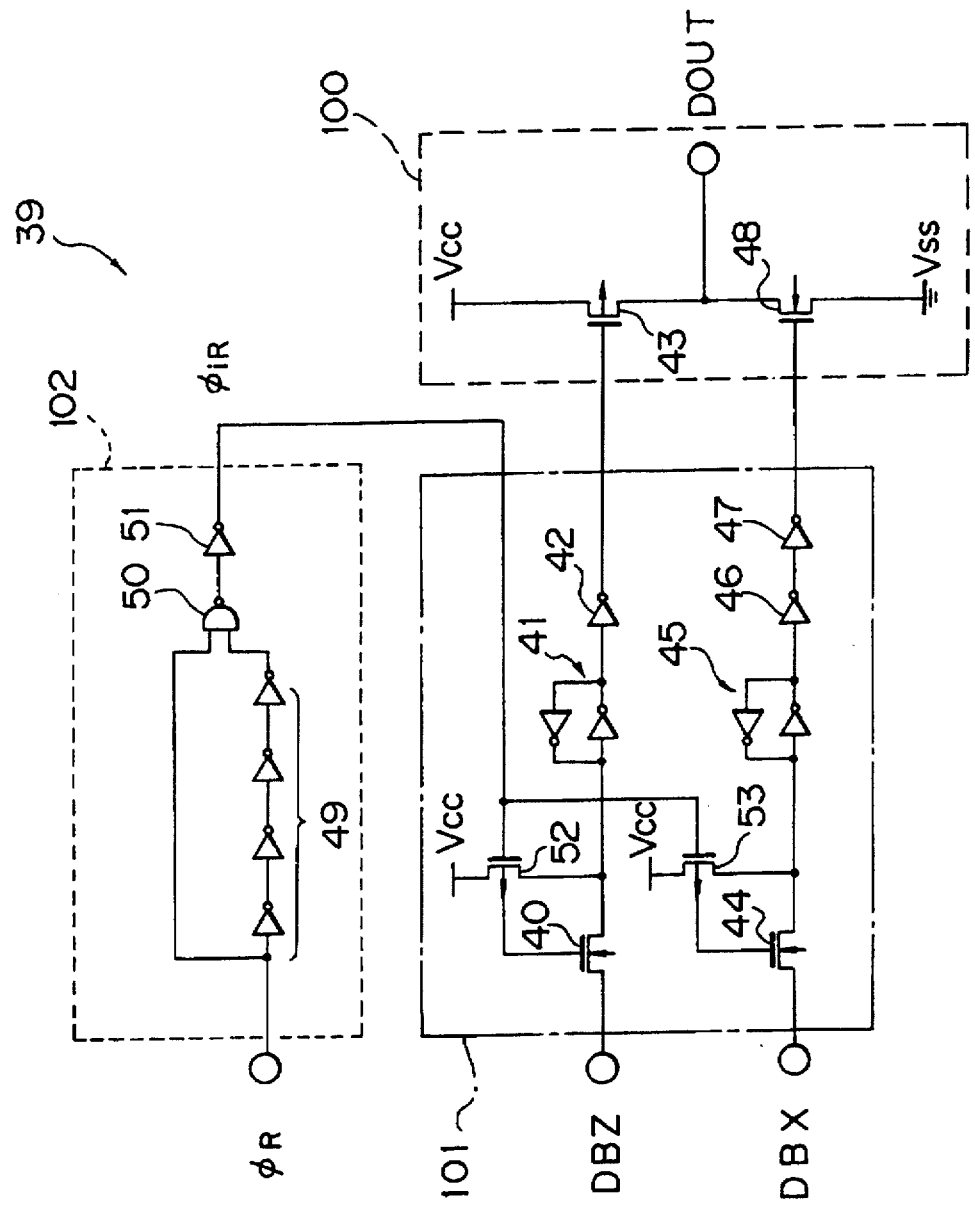
FIG. 2 is a diagram of a constitution according to the first embodiment.
Figure 3:
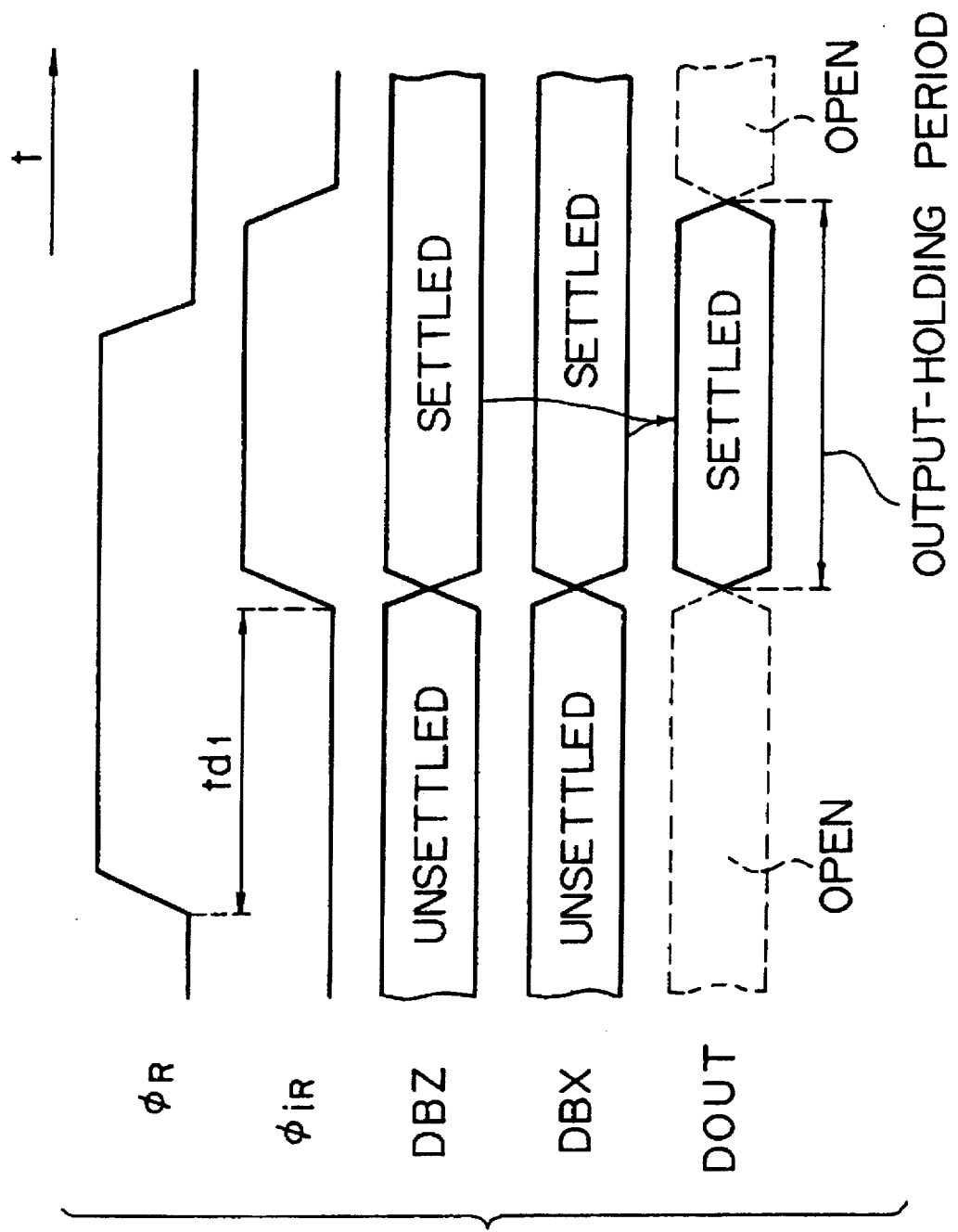
FIG. 3 is a diagram of operation waveforms according to the first embodiment.

FIGS. 1 to 3 are diagrams illustrating the output circuit according to the first aspect of the present invention as a first example.

The constitution will first be described below. FIG. 1 is a block diagram of a memory device to which the present invention is applied, wherein reference numeral 30 denotes a row address buffer/row predecoder which receives and decodes a row address in compliance with a row address strobe signal/RAS, 31 denotes a word decoder which decodes the output of the row predecoder and selects a word line, 32 denotes a column address buffer/column predecoder which receives and decodes a column address in compliance with a column address strobe signal/CAS, 33 denotes a column decoder which decodes the output of the column predecoder and selects a bit line, 34 denotes a sense amplifier/I-O gate which amplifies the potential of the selected bit line, 35 denotes a memory cell array, 36 denotes a clock generator which generates a variety of timing signals in the memory, 37 denotes a write clock generator which generates a variety of timing signals necessary for the write operation in compliance with a write enable signal/WE, 38

4 denotes a data input buffer which receives write data DIN, and reference numeral 39 denotes a data output buffer which outputs read data DOUT.

FIG. 2 is a circuit diagram illustrating main portions of the data output buffer 39 for one bit only. Between the complementary signal output data generated in the circuit (between the read data from the memory in this case), the data DBZ is added to the gate of an output transistor 43 of the high-potential side that constitutes an output stage 100 via n NMOS transistor 40, an inverter latch 41 and an inverter 42 (i.e., two stages of inverters) that constitute a logic signal input stage 101, and the data DBX is similarly added to the gate of an output transistor 48 of the low-potential side in the output stage 100 via an NMOS transistor 44, an inverter latch 45, and inverters 46, 47 (i.e., three stages of inverters) in the logic signal input stage 100.

When the output data has a logic level 1 (DBZ=1, DBX=0), a logic level 1 having the same phase as the data DBZ is added to the gate of the output transistor 43 of the high-potential side, and the logic level 1 of the phase opposite to that of the data DBX is added to the gate of the output transistor 48 of the low-potential side. In this case, therefore, the output transistor 48 of the low-potential side is turned on, and the loads (capacitive loads such as wiring, inputs, etc.) connected to the output DOUT are driven by a power source Vss of the low-potential side (e.g., 0V). Or, when the output data has a logic level 0 (DBZ=0, DBX=1), the output transistor 43 of the high-potential side is turned on, and the loads connected to the output DOUT are driven by a power source Vcc of the high-potential side (e.g., +5V).

Symbol $\phi_r$ denotes an external reset signal (predetermined reset signal) that is input to the reset signal input unit 102 to form an internal reset signal $\phi_{iR}$. The internal reset signal is obtained by finding through a NAND gate 50 a logical product of the signal $\phi_{iR}$ delayed through a serial inverter delay unit 49 of n stages (n is an even number) and of the non-delayed signal $\phi_R$, and by outputting the logical result through an inverter 51. The internal reset signal $\phi_{iR}$ works to delay the timing for raising or interrupting the reset signal $\phi_R$ by a delay time $td_1$ which is determined by the number of stages of inverters in the delay unit 49 (preferably by the time the data DBZ and DBX have settled).

When $\phi iR=0$ (first logic), NMOS transistors 40 and 44 are turned off to inhibit the receipt of data DBZ and DBX and, at the same time, PMOS transistors 52 and 53 are turned on, permitting the logic level 1 to be added to the gate of the output transistor 43 of the high-potential side and the logic level 0 to be added to the gate of the output transistor 48 of the low-potential side. During the period (reset period) in which $\phi_{iR}=0$, therefore, the output transistors 43 and 48 are both turned off, and the output DOUT is opened.

When $\phi_{iR}=1$ (second logic level), on the other hand, NMOS transistors 40 and 44 are turned on to permit the receipt of data DBZ and DBX, and either the output transistor 43 of the high-potential side or the output transistor 48 of the low-potential side is turned on depending on the logic of data DBZ and DBX. During the period in which $\phi_{iR}=1$, therefore, a power source Vcc of the high-potential side or a power source Yes of the low-potential side appears at the output DOUT via the output transistors 43 and 48 that are turned on, and the loads are driven by these power sources.

FIG. 3 is a diagram of operation waveforms according to the first example, wherein the time it takes for the output DOUT to settle corresponds to the rise time of $\phi_{iR}$ (first logic→second logic). This is because, the internal reset signal $\phi_{iR}$ is obtained by delaying the external reset signal $\phi_R$ by a time $td_1$ through the delay circuit 49, the time $td_1$ corresponding to the time for settling the output data DBZ and DBX. This makes it possible to minimize the turn-on time required for the output transistors 43 and 48, and to directly shift the potential at DOUT from an open state to a settled stage. This makes it possible to avoid an undesired change in the potential caused by the output DOUT before it has settled and, accordingly, to suppress an average value of the load current, to avoid a change in the power source potential particularly when multi-bit data are output, and hence, to preclude a cause of erroneous operation.

That is, according to this embodiment, delaying the reset signal corresponds to delaying the timing for generating the internal reset signal in the output circuit with respect to the external reset signal that is input to the output circuit. During the period in which the logic output data DBZ and DBX are unsettled, therefore, such data (DBZ, DBX, etc.) are not output from the output stage, in order to establish reliable output response for the logic signals and, at the same time, to reduce the consumption of electric power.

A second aspect of the output circuit according to the present invention will now be described with reference to FIGS. 4 and 5.

According to the second aspect of the present invention, the output circuit hold the load in an open stats when a predetermined reset signal has a first logic level, and drives the load from a high-potential power source or a low-potential power source depending on the logic level of the output data when the predetermined reset signal changes to a second logic level, wherein the load is driven for a predetermined period of time from an intermediate potential between the potential of a first power source having a predetermined high-potential side power source and the potential of a second power source having a low-potential side power source. Here, the predetermined period of time is the time during which at least the output data level input to said output circuit remains in an unsettled state.

According to the second aspect of the invention, furthermore, the load is driven for a predetermined period of time at an intermediate potential between the potential of the first power source having the high-potential side power source and the potential of the second power source having the low-potential side power source. The load is then driven by the high-potential side power source or by the low-potential side power source depending on the logic level of the output data input to the output circuit.

Figure 4:
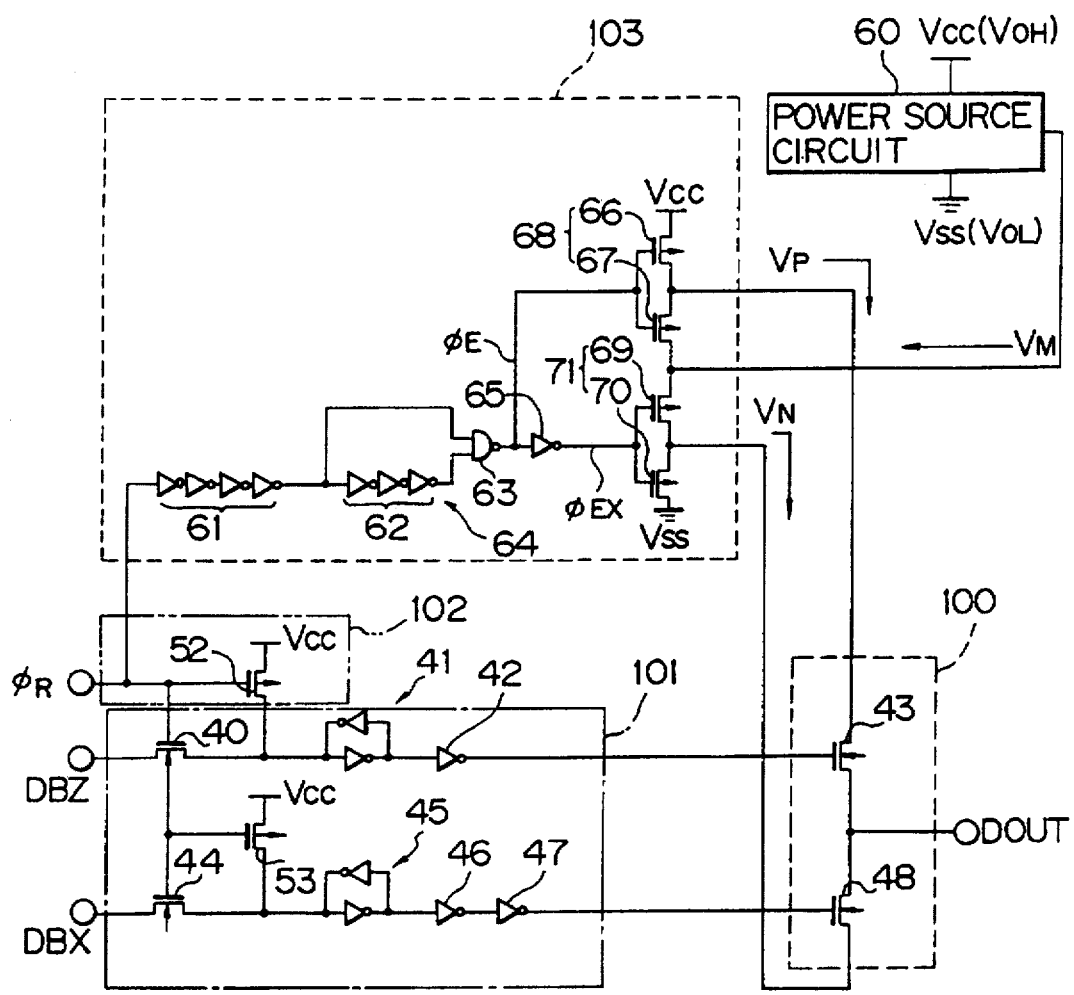
FIG. 4 is a diagram of a constitution according to a second embodiment.
Figure 5:
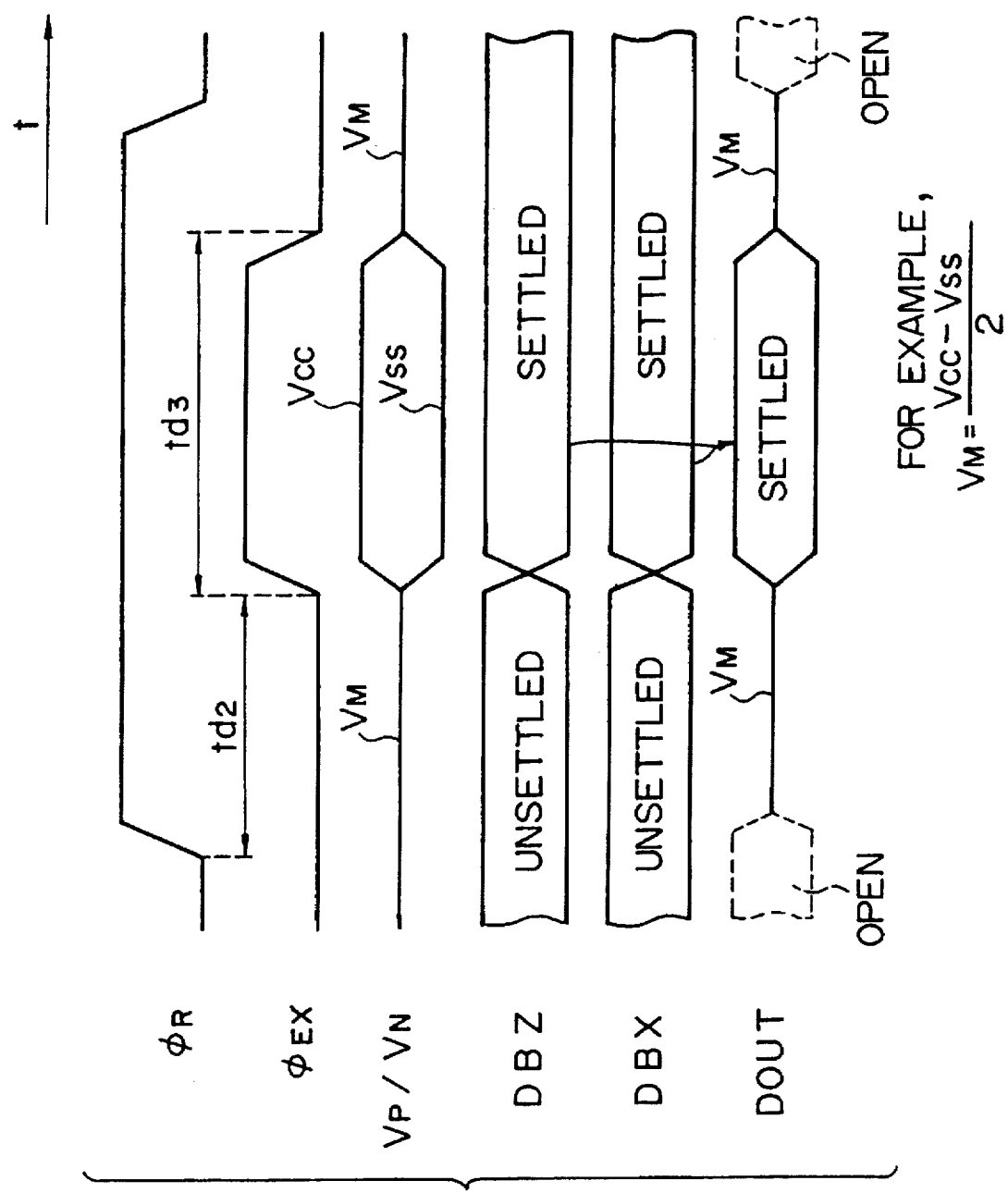
FIG. 5 is a diagram of operation waveforms according to the second embodiment.

FIGS. 4 and 5 are diagrams illustrating the output circuit according to the second aspect of the present invention as a second example, wherein the circuit elements common to those of the first example are denoted by the same reference numerals but their description is not repeated here.

In FIG. 4, reference numeral 60 denotes a power source circuit that generates an intermediate potential $V_M$ between the high-potential side power source voltage Vcc and the low-potential side power source voltage Vss, e.g., $V_M$ (Vcc–Vss)/2. Reference numeral 61 denotes a serial inverter delay unit of four stages (the number of stages is only an example here) which delays the reset signal $\phi_R$ by a predetermined time $td_2$. The pulse width of the reset signal $\phi_R$ that has passed through the delay unit 61 is adjusted to correspond to a delay time $td_3$ given by the delay unit 62 through a pulse-width adjusting circuit 64 which is made up of a serial inverter delay unit 62 of three stages (the number of stages is only an example here) and a NAND gate 63. Here, a correct logic level may not be output from the inverters in the subsequent stage when the pulse width of the reset signal $\phi_R$ is too small. Therefore, the pulse-width adjusting circuit 64 works to set the ON-width of the reset signal to a required length.

The output of the pulse-width adjusting circuit 64 is denoted by $\phi_E$, here. A signal $\phi_E$ inverted through the inverter 65 is denoted by $\phi_{EX}$. The signals $\phi_E$ and $\phi_{EX}$ are supplied to a first inverter circuit 68 consisting of a PMOS transistor 66 and NMOS transistor 67 and to a second inverter circuit 71 consisting of a PMOS transistor 69 and NMOS transistor 70. The first inverter circuit 68 outputs a voltage $V_P$ having a potential which is nearly Vcc during a period in which $\phi_E$ has the logic level 0 and having a potential which is nearly $V_M$ during a period in which $\phi_E$ has the logic level 1. The second inverter circuit 71 outputs a voltage $V_N$ having a potential which is nearly Vss during a period in which $\phi_{EX}$ has the logic level 1 and having a potential which is nearly $V_M$ during a period in which $\phi_{EX}$ has the logic level 0.

FIG. 5 is a diagram of operation waveforms according to the second example, from which it will be understood that $V_P/V_n$ assumes a potential $V_M$ during the period in which $\phi_{EX}$ has the logic level 0 (period in which $\phi_E$ has the logic level 1), and $V_P$=Vcc and $V_N$=Vss during the period in which $\phi_{EX}$ has the logic level 1 (period in which $\phi_E$ has he logic level 0).

Therefore, the potential at DOUT becomes $V_M$ (intermediate potential) during a period when DBZ and DBX have not yet settled that corresponds to the period in which $\phi_{EX}$ has the logic level 0 (period in which $\phi_E$ has the logic level 1). Moreover, the potential at DOUT assumes a value (nearly Vcc or nearly Vss) depending on the settled logic state during the period when DBZ and DBX have settled that corresponds to the period in which $\phi_{EX}$ has the logic level 1 (period in which has the logic level 0). That is, the load is driven at an intermediate potential ($V_M$) between the high-potential side power source voltage (Vcc) and the low-potential side power source voltage (Vss) and is then driven by the high-potential side power source (Vcc) or by the low-potential side power source (Vss) depending on the logic level of the output data.

As a result, the width of the potential change at DOUT is decreased from $V_M$ to Vcc (or from $V_M$ to Vss) which is about one-half he ordinary width of change, enabling the instantaneous value of the load current to be suppressed.

That is, according to the present invention, the output circuit is constituted by the output stage 100, logic output signal input stage 101, and reset signal input unit 102, and the reset signal input unit 102 and the output stage 100 are connected together via the control means 103 which is constituted by the delay circuit 61, pulse-width adjusting circuit 64, and inverter circuits 68 and 71. Among at least the two inverters 68 and 71 according to the present invention, the first inverter 68 outputs either the power source potential Vcc of the first power source or the intermediate potential $V_M$ between the predetermined first power source potential and the power source potential of the second power source and feeds it to the output stage 100 in response to the logic level of the reset signal, and the second inverter 71 outputs either the power source potential Vss of the second power source or the intermediate potential $V_M$ between the predetermined first power source potential and the power source potential of the second power source and feeds it to the output stage 100 in response to the logic level of the reset signal.

In this embodiment, the MOSFET 6 that constitutes the first inverter 68 must be a p-channel FET and the MOSFET 70 that constitutes the second inverter 71 must be an n-channel FET. By changing the manner of applying a signal voltage to gates, however, the MOSFET 67 in the first inverter 68 and the MOSFET 70 in the second inverter 71 may be either n-channel FETS or p-channel FETs.

In this embodiment of the invention, furthermore, the output level of the output stage is set to a voltage $V_M$ (=(Vcc−Vss)/2) at an intermediate level between drive voltages (Vcc−Vss) of the output circuit during a period in which the logic levels of output data DBZ and DBX have not settled. When the logic levels of output data DBZ and DBX have settled, the output level of the output stage is changed from the intermediate potential level $V_M$ into either the predetermined output level Vcc or Vss. This makes it possible to prevent the occurrence of noise and to reduce the width of a potential change in the output DOUT of the output stage to one-half the logic amplitude. Therefore, the time for outputting the high potential Vcc or the low potential Vss from the output stage can be greatly shortened compared with the time previously required for changing the output, and the instantaneous value of the load current can also be suppressed.

According to the present invention, furthermore, a node $N_1$ at which the inverters 68 and 71 are connected together is supplied with the output of an intermediate power source voltage generating circuit 60 which generates a potential $V_M$ that corresponds to an intermediate potential between the potential of the high-potential side power source, e.g., Vcc and the potential of the low-potential side power source, e.g., Vss that are the drive sources for the output circuit. As will be obvious from FIG. 4, furthermore, the output $V_P$ of the first inverter 68 is input to the source of a p-channel MOSFET 43 that constitutes the output stage 100, and the output $V_N$ of the second inverter 71 is input to the drain of an n-channel MOSFET 48 of the output stage 100. According to the present invention, there is no particular limitation on the constitution of the intermediate power source voltage generating circuit 60, and any circuit can be used provided it has the aforementioned function.

As another example, therefore, the intermediate power source voltage generating circuit 60 may be one that is different from the power source which generates the high-potential side power source voltage Vcc and the low-potential side power source voltage Vss to drive the output circuit.

For instance, the intermediate power source voltage generating circuit 60 may generate a high-potential side voltage $V_{OH}$ of 2.4V, a low-potential side voltage $V_{OL}$ of 0.8V, and an intermediate potential $V_M$ of 1.6V.

Figure 6:
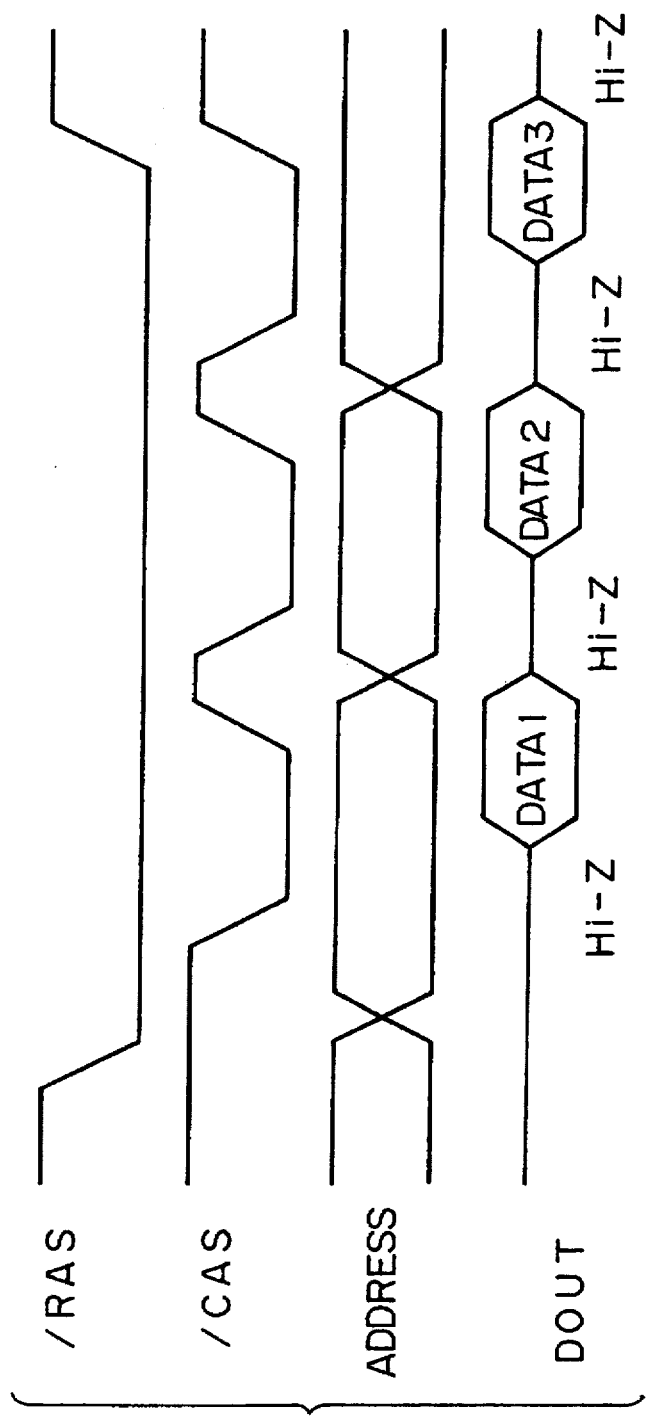
FIG. 6 is a diagram of operation waveforms of a page mode.
Figure 7:
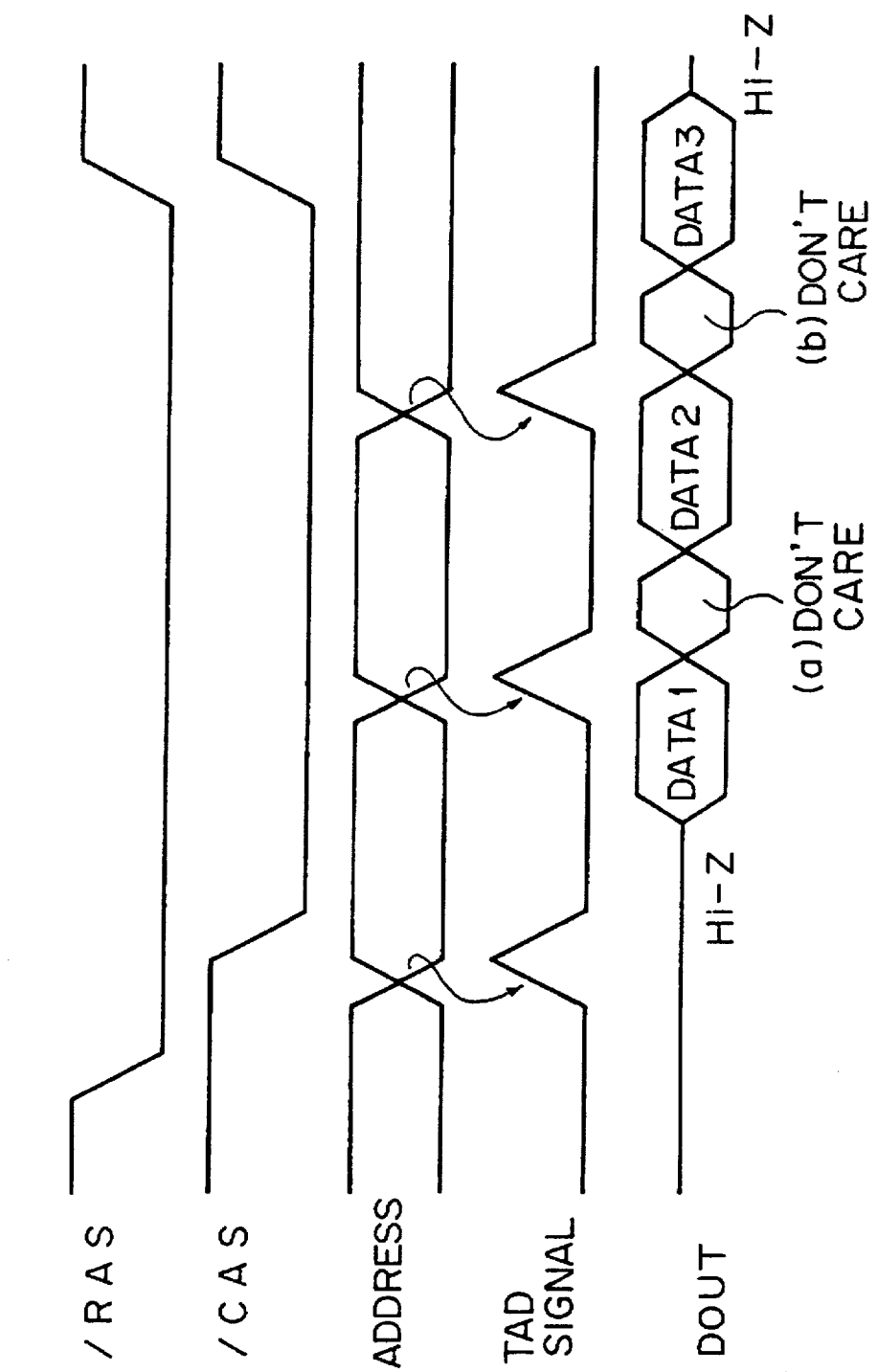
FIG. 7 is a diagram of operation waveforms of a static column mode.

The above-mentioned embodiments can be adapted to a paging mode that is shown in FIG. 6 in which an address is read in at a break of /CAS, and the output system is reset at the rise of /CAS to establish a high impedance (Hi-Z) at the output DOUT. The invention can further be adapted to a static column mode that is shown in FIG. 7 which utilizes a signal (usually an ATD signal: address transient director signal) that is formed in response to a change in the address during the L-level period of CAS, and in which the output assumes a "Don't care" state for the data.

The output circuit according to another embodiment of the first aspect of the present invention will now be described with reference to FIGS. 8 and 9, as a third example: The circuit elements common to those of the first embodiment are denoted by the same reference numerals but their description is not repeated here.

According to this example as shown in FIG. 8, the PMOS transistors 52 and 53 are turned on or off by an external reset signal $\phi_R$ that changes in synchronism with /CAS, and the NMOS transistors 40 and 44 are turned on or off by an internal reset signal $\phi_{R1}$ that changes in synchronism with the ATD signal. Reference numeral 80 denotes a pulse width extension unit which receives an ATD signal formed by a circuit (not shown) that detects a change in the address. The pulse width extension unit 80 obtains a signal $\phi_{R0}$ having an extended pulse width through a multi-stage circuit that consists of inverter gates 80a to 80f and NAND gates 80g and 80j. The number of stages of the circuit that determines the pulse width of the signal $\phi_{R0}$ is set by taking into consideration the time until the latches of DBX and DBZ have settled. Reference numeral 81 denotes delay unit which is constituted by connecting plurality of inverter gates 81a to 81d (four inverter gates in this case) in series in order to form an internal reset signal $\phi_{R1}$ by delaying the signal $\phi_{R0}$ by an amount corresponding to the number of stages of the gates.

FIG. 9 is a diagram of operation waveforms according to the third example, from which it will be learned that the data DBX and DBZ are latched while the internal reset signal $\phi_{R1}$ is at the level, and are held at the DOUT until the next time $\phi_{R1}$ is made H level by the ATD signal or until $\phi_R$ is rendered to assume the L level by /CAS. Thus, the data can be held in the "Don't care" state which is the static column mode.

FIGS. 10 and 11 are diagrams illustrating the output circuit according to another embodiment of the second aspect of the present invention shown as a fourth example and which is a modification from the second example. The circuit elements common to those of the second embodiment are denoted by the same reference numerals but their description is not repeated here.

This example is equipped with a pulse-width extension unit 80 and a delay unit 81 constituted in the same manner as those of the above third example, and with an output potential control unit 82 which outputs $V_P$=Vcc and $V_N$=Vss or $V_P=V_N=V_M$ ($V_M$ is (Vcc−Vss)/2 or $(V_{OR}-V_{OL})/2$) depending on the internal reset signal $\phi_{R1}$ that is taken out from the delay unit 81. The output potential control unit 82 is constituted by two CMOS gates 82a and 82b that are connected in series between the high-potential side power source Vcc and the low-potential side power source Vss, sends an output of the inverter gate 82c (a signal having a phase opposite to $\phi_{R1}$) to the CMOS gates 82a of the Vcc side and sends $\phi_{R1}$ directly to the CMOS gate 82b of the Vss side.

According to this example as shown in FIG. 13, therefore, the two potentials $V_P$ and $V_R$ output from the output potential control unit 82 are set to the intermediate potential $V_M$ at all times when the internal reset signal $\phi_{R1}$ that varies in synchronism with the ATD signal assumes the L level during a period in which $\phi_R$ assumes the H level. Therefore, this embodiment can be adapted even to the static column mode without any trouble. According to this example, the pulse width of the internal reset signal $\phi_{R1}$ must be set to be greater than a standardized time for holding the output.

According to the present invention, the turn-on time of the output transistor is minimized in order to suppress the average value of the load current and, in addition, the load is electrically charged with an intermediate potential prior to outputting the data in order to suppress the instantaneous value of the load current.

In the aforementioned output circuits of the present invention, the output stage 100 is constituted by CMOS circuit. According to the present invention, however, the two MOSFETs constituting the output stage may be replaced by n-channel MOSFETs.

In the output stage including CMOS circuit which chiefly uses a substrate of the p-type, there is a likelihood of developing latch-up due to overshoot at the DQ terminal.

That is, if the transistors formed in a CMOS circuit are used to constitute the output stage as shown in FIG. 14, a voltage Vcc+Vth (Vth is a threshold value of the p-n Junction) applied to the DOUT causes the p-n junction to be biased in the forward direction, whereby a current flows as indicated by a dotted line 1 which triggers the pnp transistor in the Pch-Nwell-Psub to be turned on and latched up. If it is considered that a voltage Vcc–Vth is applied to the DOUT, the p-n junction is still biased in the forward direction whereby a current flows as indicated by a dotted line 2, so that the npn transistor in the Nch-Psub-Nwell may be turned on.

If the output transistor is constituted in an Nch-Nch structure as shown in FIG. 15, on the other hand, there is no likelihood of developing the above-mentioned latch-up regardless of the amount of overshooting or undershooting.

A concrete circuit thereof may differ considerably depending upon, for example, whether a 3.3V system or 5.0V system is utilized. In the case of the 5.0V system, the output standard must satisfy TTL requirements and, hence, $V_{OH}$=2.4 and $V_{OL}$=0.4. In the case of the 3.3V system, the output standard must satisfy LVTTL requirements and, hence, $V_{OH}$=2.0 and $V_{OL}$=0.8.

When the H level is output by the n-channel transistor, the source-follower operation is employed; i.e., the level at the output terminal is decreased by the threshold voltage of one stage of n-channel transistor. That is, the H level is about 4.0V in the case of the 5.0V system, and is about 2.3V in the case of the 3.3V system. The level of 4.0V in the 5.0V system has a considerable margin with respect to $V_{OH}$=2.4V of the TTL requirement, but the level of 2.3V in the 3.3V system has very little margin with respect to $V_{OH}$=2.0V of the LVTTL requirement. As a result, the 5.0V system does not need the gate boosting but the 3.3V system needs the gate boosting, thus making a difference in the circuit.

As a result, the 5.0V system becomes nearly the same as that of the CMOS output, and the circuit constitution becomes as shown, for example, in FIG. 16. In the case of the 3.3V system which needs a means for boosting the gate of Q1 of FIG. 16, on the other hand, there can be fabricated two kinds of circuit constitutions as shown in FIG. 17. That is, in the case of FIG. 17(A), a power source circuit is separately provided to generate a level Vcc+α, and the gate of Q1 is controlled to output the level Vcc to the terminal DOUT. In the case of FIG. 17(B), Q3 is turned off and Q4 is turned on when $φ_1$=L, whereby the gate of Q1 assumes ground level to establish the Hi-Z state. When the data in which DBZ=L is read out, Q3 is turned on and Q4 s turned off, whereby the gate of Q1 is boosted to generate the level Vcc+α and to output the level Vcc to the terminal DOUT. In the case of FIG. 17(B), however, the level "H" is placed in floating condition after the gate of Q1 is once boosted. Therefore, when the data "H" is output for an extended period of time, the level Vcc+α at the gate of Q1 leaks, and the level Vcc is no longer output to the terminal DOUT. For this reason, in general, the system employing a booster power source of FIG. 17(A) is widely used.

The DRAMs to which the output circuit of the present invention can be adapted may vary depending upon the standardized modes required for the DRAMs, and the field of applications thereof may also differ depending on the types of the embodiments of the present invention described above.

At present, the kinds of the DRAMs can be roughly classified depending on the operation modes into those of 1 normal mode (read/early write/read modify write), 2 high-speed paging mode, 3 static column mode, 4 nibble mode, etc. If roughly classified depending on the number of output bits, they can be 1 one bit devices, and 2 multi-bit devices. If classified depending on the output modes, they can be 1 EDO devices, and 2 non-EDO devices. The aforementioned classifications and the fields to which the first to fourth embodiments of the invention can be adapted are diagrammed in FIG. 18.

I claim:

1. An output circuit which holds a load in an open state when a first reset signal has a first logic level, and drives the load from a first power source of a high-potential side or a second power source of a low-potential side depending on a logic level of a signal input to said output circuit when said first reset signal changes to a second logic level, comprising:

a delay means for delaying a first timing at which said first reset signal changes from said first logic level to said second logic level at least until said logic level of said input signal has settled, and for outputting a second reset signal; and a driving means for driving said load for a predetermined period of time at an intermediate potential level, said predetermined period being determined from said first timing to a second timing at which said second rest signal is changed, and said intermediate potential level being set at a constant predetermined level between potential levels output from a third power source having a high potential and a fourth power source having a low potential.

2. An output circuit according to claim 1, wherein a delay in said first reset signal corresponds to a delay in a timing for generating said second reset signal in the output circuit with respect to an external reset signal that is input to the output circuit.

3. An output circuit according to claim 1, wherein said output circuit includes an output stage, a logic output signal input stage and a reset signal input unit, wherein said reset signal input unit and said output stage are connected together via a delay circuit.

4. An output circuit according to claim 1, wherein said third power source is identical to said first power source and said fourth power source is identical to said second power source.

5. An output circuit according to claim 1, wherein said intermediate potential level is set to a middle level between said high potential and said low potential.

6. An output circuit according to claim 1, wherein said predetermined period of time is set to a period corresponding to a period during which at least the logic level of said input signal input to said output circuit remains in an unsettled state.

7. An output circuit according to claim 1, wherein said driving means comprises at least a first inverter and a second inverter, said first inverter outputting either said high potential level of said third power source or said predetermined intermediate potential level between said high potential level output from said third power source and said low potential level output from said fourth power source, and said second inverter outputting either said low potential level of said fourth power source or said predetermined intermediate potential level between said high potential level output from said third power source and said low potential level output from said fourth power source.

8. An output circuit which holds a load in an open state when a first reset signal has a first logic level, and drives the load from one of a first power source having a high-potential level and a second power source having a low-potential level depending on a logic level of a signal input to said output circuit when said first reset signal changes to a second logic level, said circuit comprising a driving means for driving said load for a predetermined period of time, at a predetermined constant intermediate potential level, said predetermined period being determined from a first timing at which said first reset signal changes from said first logic level to said second logic level to a second timing at which a second reset signal is changed, and said predetermined intermediate potential level being set at the level between potential levels output from a third power source having a high potential and a fourth power source having a low potential.

9. An output circuit according to claim 8, wherein said third power source is identical to said first power source and said fourth power source is identical to said second power source.

10. An input circuit according to claim 8, wherein said predetermined constant intermediate potential level is set to a middle level between said high potential and said low potential.

11. An output circuit according to claim 8, wherein said predetermined period of time is set to a period corresponding to a period during which at least the logic level of said input signal input to said output circuit remains in an unsettled state.

12. An output circuit according to claim 8, wherein the load is driven for said predetermined period of time from said predetermined constant intermediate potential between said high-potential level output from said third power source and said low-potential level output from said fourth power source and is then driven at said high-potential level from one of said first power source and said third power source or said low potential level from one of said second power source and said fourth power source, depending on a logic state of the input signal input to said output circuit.

13. An output circuit according to claim 8, wherein said driving means comprises at least a first inverter and a second inverter, said first inverter outputs either said high potential level of said third power source or said predetermined constant intermediate potential level between said high potential level output from said third power source and said low potential level output from said fourth power source, and feeds the output potential level of said first inverter to an output stage in response to the first logic level of said first reset signal, and said second inverter outputs either said low potential level of said fourth power source or said predetermined constant intermediate potential level between said high potential level output from said third power source and said low potential level output from said fourth power source, and feeds the output potential level of the second inverter to said output stage in response to the first logic level of said first reset signal.

14. An output circuit according to claim 8, wherein said output circuit includes an output stage, a logic output signal input stage and a reset signal input unit, wherein said reset signal input unit and said output stage are connected together via control means which includes a delay circuit, a pulse-width adjusting circuit and an inverter circuit.

* * * * *